United States Patent [19]

Mihalich et al.

[11] 4,295,062
[45] Oct. 13, 1981

[54] CMOS SCHMITT TRIGGER AND OSCILLATOR

[75] Inventors: Stephen K. Mihalich, Santa Clara; Thomas S. W. Wong, Sunnyvale, both of Calif.

[73] Assignee: National Semiconductor Corporation, Santa Clara, Calif.

[21] Appl. No.: 26,277

[22] Filed: Apr. 2, 1979

[51] Int. Cl.³ .................... H03K 3/295; H03K 3/354; H03K 4/48
[52] U.S. Cl. .................................. 307/279; 307/228; 307/290; 331/111
[58] Field of Search ............... 307/205, 279, 288, 290, 307/246, 228; 331/111

[56] References Cited

U.S. PATENT DOCUMENTS

| | | | |
|---|---|---|---|
| 3,812,384 | 5/1974 | Skorup | 307/279 X |
| 3,851,189 | 11/1974 | Moyer | 307/279 |
| 3,873,856 | 3/1975 | Gerlach | 307/290 X |
| 3,904,988 | 9/1975 | Hsiao | 331/111 |
| 3,921,101 | 11/1975 | McCoy et al. | 331/111 X |
| 3,984,703 | 10/1976 | Jorgensen | 307/290 X |
| 4,001,722 | 1/1977 | Patel et al. | 331/111 |
| 4,063,225 | 12/1977 | Stewart | 307/279 X |
| 4,107,549 | 8/1978 | Mouftah | 307/279 X |
| 4,110,704 | 8/1978 | Irwin et al. | 331/111 X |
| 4,122,413 | 10/1978 | Chen | 331/111 X |

*Primary Examiner*—Larry N. Anagnos
*Attorney, Agent, or Firm*—Gail W. Woodward; James A. Sheridan

[57] ABSTRACT

A CMOS Schmitt trigger circuit displays a lower trigger point that is one N channel transistor threshold above the negative power supply potential and an upper trigger point that is one P channel transistor threshold below the positive power supply potential. Thus, the circuit hysteresis loop is related to supply potential and device threshold values. When the trigger circuit is employed in a relaxation oscillator configuration, the oscillator frequency is independent of power supply voltage and manufacturing variables in the CMOS process that vary transistor threshold values.

9 Claims, 9 Drawing Figures

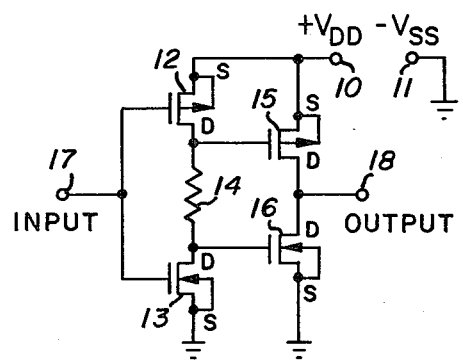
Fig_1
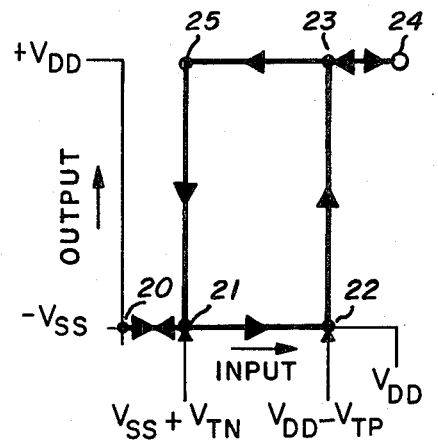
Fig_2
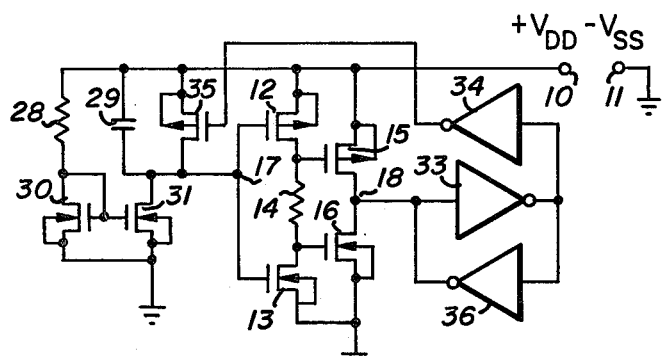
Fig_3
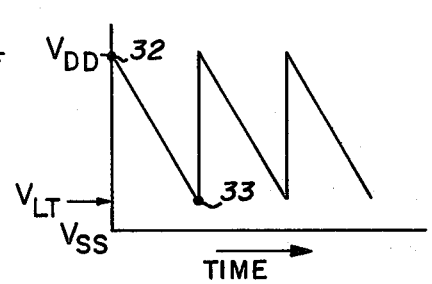
Fig_4
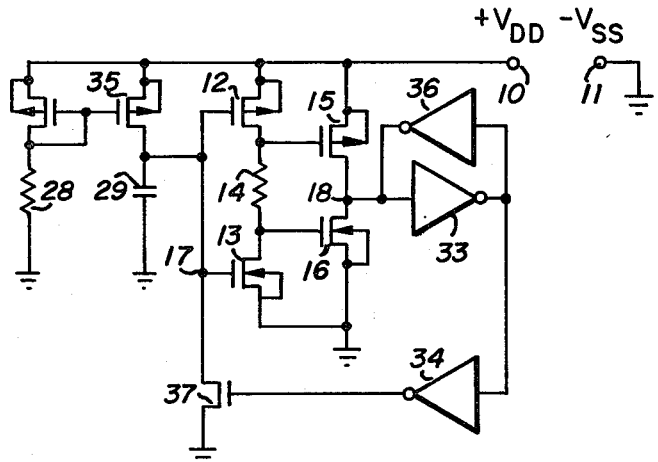
Fig_5
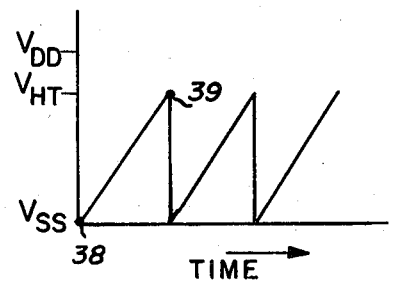
Fig_6

CMOS SCHMITT TRIGGER AND OSCILLATOR

BACKGROUND OF THE INVENTION

The invention relates to circuits having pronounced hysteresis in their input-output transfer function. Such circuits are commonly called Schmitt trigger circuits. Such circuits are useful in noise suppression and are widely used in relaxation oscillators. A CMOS Schmitt trigger circuit is disclosed and claimed in U.S. Pat. No. 3,984,703 to John M. Jorgensen and assigned to the assignee of the present invention. An input circuit is shown having a symmetrical hysteresis characteristic is followed by a latch and an output inverter.

SUMMARY OF THE INVENTION

It is an object of the invention to provide a CMOS Schmitt trigger circuit of simple construction and which has a hysteresis loop that is related to power supply voltage.

It is a further object of the invention to employ a Schmitt trigger circuit in a CMOS relaxation oscillator in which frequency is independent of power supply and transistor threshold voltage.

These and other objects are achieved in the following configuration. A pair of complementary transistors are coupled in series with a high value resistor across power supply rails. The N channel transistor source is coupled to the negative rail and the P channel transistor source is coupled to the positive rail. The transistor gates are coupled together and comprise the stage input terminal. A second pair of complementary transistors are series connected between supply rails with their drain electrodes coupled together to comprise the stage output terminal. The gate electrodes of the second pair of transistors are directly coupled, respectively, to the two ends of resistor in series with the first pair. It is preferred that the supply voltage exceeds the sum of N and P transistor thesholds. The stage will have a transfer characteristic that displays hysteresis and the width of the hysteresis loop will be directly proportional to power supply voltage.

The above-described stage can be employed in a relaxation oscillator based upon the charge and discharge of a capacitor. The Schmitt trigger is connected to sense the capacitor voltage. When the upper trigger point is reached, the trigger circuit operates a control circuit to discharge the capacitor. When the capacitor charge drops to the lower trigger point, the trigger circuit operates a control circuit that charges the capacitor. Thus, the capacitor charge will cycle between the trigger points. If the capacitor control circuit charges and discharges the capacitor using a constant current that is related to supply potential, as the power supply potential rises, the capacitor will charge more rapidly, but this is offset by the increased upper trigger point so that frequency is independent of supply voltage over wide limits.

If the capacitor charging circuit is obtained with a transistor current mirror, the current will be varied as a function of transistor threshold voltage. Thus, any variation in threshold voltage results in a variation in capacitor charging. This can be employed to compensate the variations introduced in the Schmitt trip levels that ordinarily would vary oscillator frequency.

BRIEF DESCRIPTION OF THE DRAWING

FIG. 1 is a schematic diagram of the basic CMOS Schmitt trigger circuit;

FIG. 2 is a graph showing the transfer characteristic of the circuit of FIG. 1;

FIG. 3 is a schematic diagram of a relaxation oscillator using the Schmitt trigger of the invention to generate a falling sawtooth output;

FIG. 4 is a graph showing the output waveform of the circuit of FIG. 3;

FIG. 5 is a schematic diagram of a relaxation oscillator using the Schmitt trigger of the invention to generate a rising sawtooth output;

FIG. 6 is a graph showing the output waveform of the circuit of FIG. 5;

DESCRIPTION OF THE INVENTION

Figure 7:
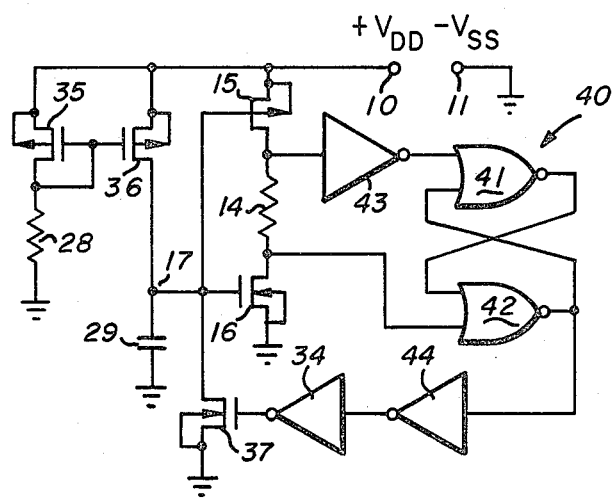
FIG. 7 is a schematic diagram of an alternative circuit for that of FIG. 5.

The invention to be described is intended for use with conventional CMOS constructed integrated circuit (IC) devices. Since conventional CMOS is intended and is a well-known form of IC construction, it will not be further detailed herein. The devices shown are of conventional high voltage design and will operate over the conventionally specified CMOS voltage range of about 3 to 18 volts.

FIG. 1 shows a four transistor CMOS Schmitt trigger circuit. Power supply rails designated by terminals 10 and 11 represent $+V_{DD}$ and $-V_{SS}$, respectively. Terminal 11 is shown grounded according to convention. In all of the transistors to be described herein, the body of the transistor is connected directly to the source electrode unless otherwise stated.

P channel transistor 12 is coupled in series with N channel transistor 13 and resistor 14 between the power supply rails. The gate electrodes of transistors 12 and 13 are connected together to comprise input terminal 17 for the circuit. Resistor 14 is a high value resistor, typically 1–5 megohms. This value is selected to be much larger than the equivalent resistance represented by an on transistor. Its value is not critical.

The drain of transistor 12 is directly coupled to the gate of a second P channel transistor 15. The drain of transistor 13 is directly coupled to the gate of a second N channel transistor 16. Transistors 15 and 16 are also coupled in series between power supply rails and their commonly connected drain electrodes comprise the output terminal 18 for the circuit.

For the operation of the circuit, refer to the graph of FIG. 2. The abscissa represents input voltage at terminal 17 and the ordinate represents output voltage at terminal 18. As a starting point, it will be assumed that the input is grounded to produce point 20 on the curve. This turns transistor 13 off and transistor 12 on. The drain of transistor 12 will pull the gate of transistor 15 close to $V_{DD}$ and turn it off. The gate of transistor 16 will be pulled up via resistor 14, thereby turning it on. This pulls the output terminal 18 close to ground as shown at curve point 20. In this condition, transistor 16 sinks the output to ground.

As the input potential rises, as shown by the arrows on the curve, point 21 will be reached where transistor 13 turns on and this turns transistor 16 off. However, transistor 12 will remain on, thus holding transistor 15 off, and the output will remain at zero. In the interval between points 21 and 22, both transistors 12 and 13 will be on and resistor 14 limits the current that flows therein. Also during this interval, both transistors 15 and 16 will be off, thus allowing the output to float. When the input rises to point 22, transistor 12 will turn off. In this state, transistor 13 will hold transistor 16 off and, via resistor 14, will pull the gate of transistor 15 down and turn it on. Now, transistor 15 will pull terminal 18 close to $V_{DD}$ and point 23 will be reached. This state will hold as the input rises to $V_{DD}$ at point 24.

Thus, the transfer function produces a transition between points 22 and 23 for a rising input to define what is called the high trigger or $V_{HT}$ for the circuit. The actual value is:

$$V_{HT} = V_{DD} - V_{TP} \quad (1)$$

where $V_{TP}$ is the threshold voltage for a P channel transistor (transistor 12 in this case).

Starting now at point 24 on the curve, where both input and output are high, the input will be moved toward low as shown by the reverse arrows. When point 23 is reached, transistor 12 will turn on and this will turn transistor 15 off. However, since transistor 16 is off, nothing will happen at the output 18. As before, both transistors 12 and 13 will be on in the interval 23 to 25 and resistor 14 limits the current flow. Also both transistors 15 and 16 will be off and the output floating. As the input goes lower, point 25 will be reached where transistor 13 turns off. This permits on transistor 12 to pull the base of transistor 16 up via resistor 14 and turn it on. Transistor 16 will then pull the output 18 low to point 21 as shown. As the input reverts to point 20, the output remains low. Thus, a low trigger transition $V_{LT}$ is defined by the graph points between 25 and 21. The actual value will be:

$$V_{LT} = V_{SS} + V_{TN} \quad (2)$$

where $V_{TN}$ is the threshold voltage of an N channel transistor (transistor 13 in this case).

From the above, it can be seen that as long as the supply voltage exceeds the sum of thresholds for P and N channel transistors, the circuit of FIG. 1 will have a transfer function with a hysteresis loop. The loop width, which is defined as $V_{HT} - V_{LT}$, will be directly proportional to $V_{DD} - V_{SS}$ (the supply voltage).

It will be noted that inside the hysteresis loop output terminal 18 will be floating. Therefore, it is common practice to follow the circuit of FIG. 1 with a latch. This was disclosed in above referenced U.S. Pat. No. 3,984,703. The latch is basically an inverter 33. A second inverter 36 is coupled thereacross to provide positive feedback. Inverter 36 is made to have lower gain than inverter 33 so the latch can readily be tripped. The action of inverter 33 is merely to hold inverter 33 in whatever state it is forced to assume. This action overcomes the floating state of the Schmitt trigger.

In the following circuit discussions where the parts are as were described in FIG. 1, like numbers will be used. FIG. 3 shows an R-C relaxation oscillator using the Schmitt trigger circuit of FIG. 1.

Resistor 28 and capacitor 29 are the oscillator frequency determining components and will typically be off chip parts. However, if desired, they can be incorporated directly into the IC.

Resistor 28 is coupled in series with N channel transistor 30 which has its gate connected to its drain terminal. The voltage drop across transistor 30 will be its threshold voltage. The current flowing in resistor 28 is:

$$I_{28} = (V_{DD} - V_{TN})/R_{28}. \quad (3)$$

It can be seen that the current in resistor 28 will be linearly proportional to $V_{DD}$. Transistor 30 in conjunction with transistor 31 forms a current mirror. Therefore, if these devices are the same size (unratioed), the current flowing in transistor 31 will be equal to the current in resistor 28. Thus, transistor 31 will operate at constant current and linearly charge capacitor 29.

With reference to FIG. 4, a starting point 32 will be assumed where there is zero charge on capacitor 29. Input terminal 17 will be high (at $V_{DD}$) and output terminal 18 will be high. Inverters 33 and 34 will cause the gate of transistor 35 to be high, thus turning it off. Capacitor 29 will charge linearly through transistor 31 as described above and the voltage at terminal 17 will decline linearly.

Inverter 36 is connected across inverter 33 to form a latch which will retain the original state of the Schmitt trigger circuit even though its output floats inside its hysteresis loop.

Capacitor 29 will continue to charge until the potential at terminal 17 drops to the low trigger point $V_{LT}$. At point 33 terminal 18 goes low, the latch comprising inverters 33 and 36 is tripped, and inverter 34 will pull the gate of transistor 35 low and turn it on. Transistor 35 is made to have a relatively large channel width so that when on it will rapidly discharge capacitor 29, thereby pulling terminal 17 rapidly to $V_{DD}$. Ordinarily, it would be expected that the circuit would trip at $V_{HT}$ and prevent the rise to $V_{DD}$. However, it can be seen that the rise is very rapid. Also inverters 33 and 34 impose a transmission delay that prevents the overall feedback loop from acting too soon. This delay can easily be made sufficiently long to permit the capacitor to fully discharge so that terminal 17 will rise to $V_{DD}$.

At this point, the cycle of events will repeat. It can be seen that the oscillator frequency is determined exclusively by resistor 28 and capacitor 29. If $V_{DD}$ rises, a proportionately longer discharge is needed to reach $V_{LT}$. Additionally, the rise in $V_{DD}$ will increase the current in resistor 28 in the same proportion and speeds up the capacitor charging. The frequency of the circuit is $$F = 1(R_{28} \times C_{29}) \quad (4)$$

were $R_{28}$ is in ohms and $C_{29}$ is in farads and F is in cycles per second.

The circuit is also independent of the transistor threshold voltage. In conventional circuits it is very difficult to compensate for changes in threshold voltage variation which accompany the CMOS manufacturing processes. In reference to FIGS. 3 and 4, it can be seen that $V_{LT}$ is the threshold voltage of transistor 13. Any variation in this value will change the charge on capacitor 29 at the trip point 33. It can be seen that transistor 30, which is part of a current mirror, is connected so that it develops $V_{TN}$ across its terminals. Equation 3 shows that the current in resistor 28 is a function of $V_{TN}$. Thus, as $V_{TN}$ falls so as to increase the capacitor charge the current in resistor 28 will increase in proportion to cancel the effect. Therefore, the circuit of FIG. 3 is fully compensated for both changes in $V_{DD}$ and transistor threshold voltage variation.

In FIG. 5, resistor 28 and capacitor 29 are both returned to ground or $V_{SS}$. P channel transistors 35 and 36 form a current mirror for charging the capacitor at a constant current as determined by $V_{DD}$. This circuit is the complement of FIG. 3 and produces a positive going sawtooth as shown in FIG. 6.

With reference to FIG. 6, a discharged capacitor state at 38 is the assumed starting point. With terminal 17 low, terminal 18 is low and the gate of transistor 37 is low, thereby turning it off. Capacitor 29 will charge through transistor 36 which mirrors the current in transistor 35 and resistor 28. The current in resistor 28 is determined as follows:

$$I_{28} = (V_{DD} - V_{TP})/R_{28} \tag{5}$$

In this circuit the P channel transistor threshold will, in part, determine the capacitor charging current. The charging will continue until point 39 is reached whereupon terminal 18 goes high (at $V_{HT}$). The gate of transistor 37 will be pulled high by inverters 33 and 34, thereby turning it on and discharging capacitor 29 to $V_{SS}$ whereupon the cycle then repeats. Since the upper trip $V_{TH}$ is determined by the threshold of a P channel transistor (transistor 12 in this case), the action of transistor 35 on the capacitor charging current will compensate the effect of $V_{TP}$ variations. As was the case in FIG. 3, the $V_{DD}$ variation is also fully compensated.

FIG. 7 shows a relaxation oscillator that employs a modification of the FIG. 1 Schmitt trigger circuit in a configuration similar to that of FIG. 5. While not specifically shown, the circuit of FIG. 3 could be similarly modified. Transistors 15 and 16 along with resistor 14 are as shown in FIGS. 1 and 5. Transistors 35, 36, and 37 along with resistor 28, capacitor 29 and inverter 34 are also similar. However, the drains of transistors 15 and 16 are coupled to a logic array. A latch 40 is composed of a pair of NOR gates 41 and 42. Gate 41 is driven from the drain of transistor 15 through inverter 43. The input to gate 42 is directly from the drain of transistor 16. Inverter 44 couples the output from gate 42 to inverter 34.

When terminal 17 is low transistor 15 is on and transistor 16 is off. Thus, transistor 15 pulls the input to inverter 43 high along with the input to gate 42 (via resistor 14). Thus the input to gate 41 is low. For these conditions, the output of gate 42 is low which, via inverters 44 and 34, turns transistor 37 off. Capacitor 29 will charge linearly as described above in connection with FIG. 5. When transistor 16 turns on it will pull the input to gate 42 low, but this will have no effect on latch 40. When the charge reaches $V_{TP}$ below $V_{DD}$ transistor 15 will turn off and transistor 16 through resistor 14 will pull the input to inverter 43 low so as to drive the input to gate 41 high. Thus, the output of gate 41 will go low so that both inputs to gate 42 are low, thereby causing its output to go high and turn transistor 37 on via and inverters 44 and 34. This will then discharge capacitor 29 to ground the latch will be reset to its original state. The circuit (and its complement) otherwise operates as does the circuit of FIG. 5 (and FIG. 3).

The capacitor discharge transistors in FIGS. 3, 5, and 7 are made large (wide channels) so that the capacitor can be discharged very rapidly and this permits $V_{DD}$ and threshold compensation to a very satisfactory level. The circuit of FIG. 8 produces a back-to-back sawtooth and is fully compensated without requiring any large transistors.

Figure 8:
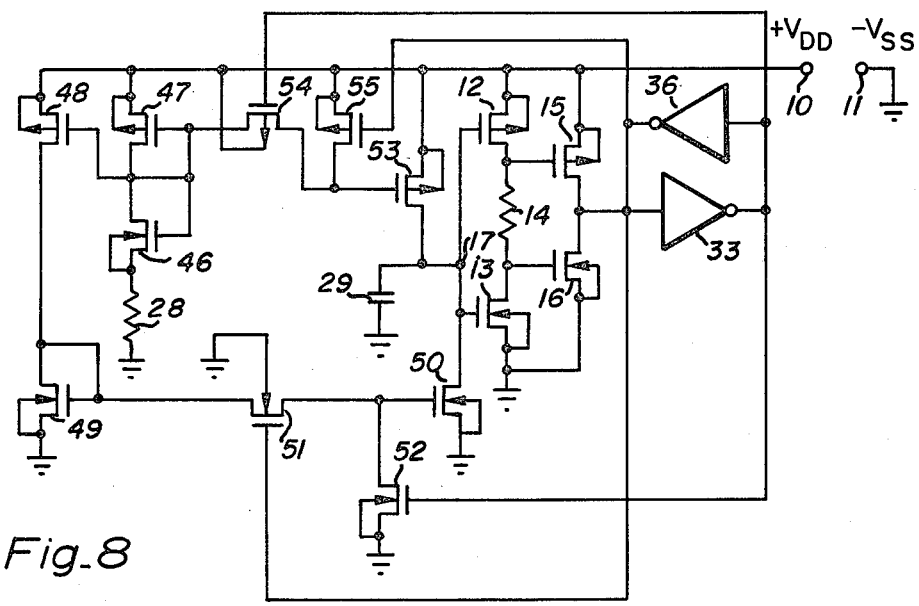
FIG. 8 is a schematic diagram of a relaxation oscillator using the Schmitt trigger of the invention to generate a back-to-back sawtooth output.

In FIG. 8, capacitor 29 and resistor 28 are both referenced to ground. The current flowing in resistor 28 will be:

$$I_{28} = [V_{DD} - (V_{TN} + V_{TP})]/R_{28} \tag{5}$$

where $V_{TN} + V_{TP}$ is the sum of thresholds (in this case the thresholds of transistors 46 and 47). Accordingly, the current in resistor 28 is directly proportional to $V_{DD}$ and negatively proportional to the sum of thresholds. Transistor 47, in conjunction with transistor 48, mirrors this current into transistor 49. Transistor 49, in conjunction with transistor 50, will again mirror this current into discharge transistor 50 but only under the conditions that transistor 52 is off and transistor 51 is on.

Similarly, transistor 47 also forms a current mirror with charging transistor 53 which will mirror $I_{28}$ provided transistor 54 is on and transistor 55 is off.

Figure 9:
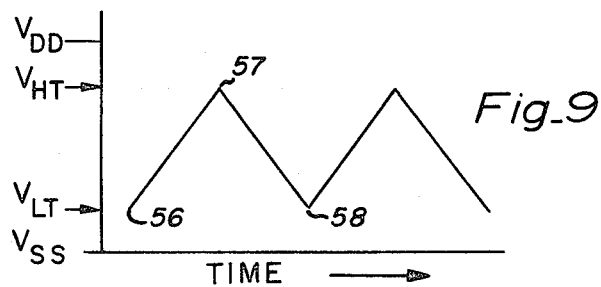
FIG. 9 is a graph showing the output waveform of the circuit of FIG. 8.

Referring now to FIGS. 8 and 9, a starting point 56 will be assumed where capacitor 29 is substantially discharged and terminal 17 will be low. This means terminal 18 is low and transistors 51 and 55 will be off. The output of inverter 33 will be high to turn transistors 52 and 54 on. This means that transistor 50 will be off and transistor 53 will mirror the current in resistor 28 and linearly charge capacitor 29 as shown. When point 57 is reached ($V_{HT}$) terminal 18 will go high, thus turning transistors 51 and 55 on. The output of inverter 33 will go low to turn transistors 52 and 54 off. Thus, discharge transistor 50 will turn on and discharge capacitor 29 at a rate determined by the current in resistor 28. This discharge will continue until point 58 is reached whereupon the cycle will repeat.

Since the charge and discharge are relatively slow, large transistors are not needed. Furthermore, there is no delay responsive overshoot and the oscillation is confined to between $V_{HT}$ and $V_{LT}$ limits. As was the case with the circuits of FIGS. 3, 5, and 7, variations in $V_{DD}$ will be compensated by a variation in capacitor charging and discharging rate.

In terms of threshold compensation, it can be seen that both $V_{HT}$ and $V_{LT}$ will change the voltage swing. However, as shown in equation 5 the current in resistor 19 will be a function of the sum of thresholds ($V_{TN} + V_{TP}$). This means that both trip points will be compensated for threshold variations.

While the above discussions have assumed unity gain current mirrors, this need not be the case, particularly with respect to the circuit of FIG. 8. The mirror action need only be linear. The devices can be ratioed to create a current gain or loss in the mirror action. Since the rise and fall of the wave form of FIG. 9 is due to the action of independent current mirrors, ratioing can be used to independently control the shape of the back-to-back sawtooth.

The invention has been described and several functional embodiments detailed. Clearly there are alternatives and equivalents that will occur to a person skilled in the art. Accordingly, it is intended that the invention be limited only by the claims that follow.

We claim:

1. A complementary metal oxide semiconductor trigger circuit having a non-inverting signal transfer characteristic that displays hysteresis, said circuit having first and second power supply rails connectible to a source of operating voltage and comprising:
- a resistor having a value that is large with respect to the on resistance of an active transistor and having first and second terminals;
- a first P channel transistor having a source coupled to said first supply rail, a drain coupled to said first resistor terminal, and a gate;
- a second N channel transistor having a source coupled to said second supply rail, a drain coupled to said second resistor terminal, and a gate;
- means for coupling said gates of said first and second transistors together to comprise an input terminal to said circuit;
- a third P channel transistor having a source coupled to said first supply rail, a gate coupled to said drain of said first transistor, and a drain;
- a fourth N channel transistor having a source coupled to said second supply rail, a gate coupled to said drain of said second transistor, and a drain; and
- means for coupling said drains of said second and third transistors together to comprise an output terminal to said circuit whereby the output signal is responsive to the potential difference developed between said first and second resistor terminals to provide first and second logic state output signals, said first logic state being produced when said input terminal is operated at a potential that lies between the potential of said first supply rail and the threshold potential of said first transistor and said second logic state being produced when said input terminal is operated at a potential that lies between the potential of said second supply rail and the threshold potential of said second transistor.

2. The trigger circuit of claim 1 wherein said output means terminal is coupled to a latch having an input coupled to said drains of said third and fourth transistors and an output that provides a logic signal that is the complement of the signal present at said output terminal.

3. The trigger circuit of claim 2 where said latch comprises:
- a first inverter having an input coupled to said drains of said third and fourth transistors and an output; and
- a second inverter having an input coupled to said output of said first inverter and an output coupled to said input of said first inverter, said second inverter having a lower gain than that of said first inverter.

4. A complementary metal oxide semiconductor trigger circuit having a transfer characteristic that displays hysteresis, said circuit having first and second power supply rails connectible to a source of operating voltage and comprising:
- a resistor having a value that is large with respect to the on resistance of an active transistor and having first and second terminals;
- a first P channel transistor having a source coupled to said first supply rail, a drain coupled to said first resistor terminal, and a gate;
- a second N channel transistor having a source coupled to said second supply rail, a drain coupled to said second resistor terminal, and a gate;
- means for coupling said gates of said first and second transistors together to comprise an input terminal to said circuit; and
- output means responsive to the potential difference developed between said first and second resistor terminals to provide first and second logic state output signals, said first logic state being produced when said input terminal is operated at a potential that lies between the potential of said first supply rail and the threshold potential of said first transistor and said second logic state being produced when said input terminal is operated at a potential that lies between the potential of said second supply rail and the threshold potential of said second transistor wherein said output means further comprise:
- a latch circuit having two stable states, first and second input terminals and an output terminal;
- an inverter having an input coupled to said drain of said first transistor and an output coupled to said first input of said latch circuit; and
- means coupling said drain of said second transistor to said second input of said latch circuit whereby said latch circuit output will assume a state determined by said potential on said input terminal.

5. The trigger circuit of claim 3 or 4 in combination with additional means to create a relaxation oscillator, said additional means comprising:
- a capacitor
- means for charging said capacitor;
- means for discharging said capacitor in response to one of said logic states; and
- means for coupling said capacitor to said input terminal whereby said trigger circuit senses the charge on said capacitor.

6. The oscillator of claim 5 wherein said means for charging includes means for maintaining a constant current during said charge.

7. The oscillator of claim 6 wherein said means for charging comprise a first current mirror in which a second resistor determines said charging current and series connected transistor means whereby said series transistor means produces a potential equal to a transistor threshold so that said charging current is a function of the value of said threshold and variations in the threshold values of said first and second transistors are compensated.

8. The oscillator of claim 7 wherein said means for discharging further includes means for maintaining a constant current during said discharge.

9. The oscillator of claim 8 wherein said means for discharging comprise a second current mirror in which said second resistor determines said discharging current, said first and second current mirror means being operated alternately in response to said logic state.

* * * * *